US006677208B2

(12) United States Patent
Mehrotra et al.

(10) Patent No.: US 6,677,208 B2
(45) Date of Patent: Jan. 13, 2004

(54) TRANSISTOR WITH BOTTOMWALL/SIDEWALL JUNCTION CAPACITANCE REDUCTION REGION AND METHOD

(75) Inventors: Manoj Mehrotra, Plano, TX (US); Kaiping Liu, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/253,827

(22) Filed: Sep. 24, 2002

(65) Prior Publication Data

US 2003/0062572 A1 Apr. 3, 2003

Related U.S. Application Data

(60) Provisional application No. 60/326,161, filed on Sep. 28, 2001.

(51) Int. Cl.[7] .............................................. H01L 21/336
(52) U.S. Cl. ...................... 438/289; 438/301; 438/300; 438/303
(58) Field of Search ................................. 438/275, 289, 438/183, 301, 305, 300, 303, 299, 302

(56) References Cited

U.S. PATENT DOCUMENTS

| 5,917,219 | A  |   | 6/1999  | Nandakumar et al. |          |
|-----------|----|---|---------|-------------------|----------|
| 5,976,937 | A  | * | 11/1999 | Rodder et al.     | 438/275  |
| 6,093,610 | A  | * | 7/2000  | Rodder            | 438/289  |
| 6,124,627 | A  | * | 9/2000  | Rodder et al.     | 438/300  |
| 6,228,725 | B1 | * | 5/2001  | Nandakumar et al. | 438/289  |
| 6,521,502 | B1 | * | 2/2003  | Yu                | 438/305  |
| 6,524,901 | B1 | * | 2/2003  | Trivedi           | 438/183  |

* cited by examiner

Primary Examiner—John F. Niebling
Assistant Examiner—Walter L. Lindsay, Jr.
(74) Attorney, Agent, or Firm—Peter K. McLarty; W. James Brady, III; Frederick J. Telecky, Jr.

(57) ABSTRACT

A method of fabricating a transistor comprises forming a gate structure outwardly of a semiconductor substrate, wherein the gate structure comprises a gate, a gate insulator and sidewalls and forming source region and a drain region in the substrate using the gate structure as a mask, wherein a channel is defined in the substrate between the source region and the drain region. A bottomwall/sidewall junction capacitance reduction region extending within and between the source region and the drain region is formed, wherein the bottomwall/sidewall junction capacitance reduction region extends at least partially through the bottomwall junction or the sidewall junction.

8 Claims, 3 Drawing Sheets

TRANSISTOR WITH BOTTOMWALL/ SIDEWALL JUNCTION CAPACITANCE REDUCTION REGION AND METHOD

This application claims priority under 35 USC §119(e)(1) of provisional application Ser. No. 60/326,161, filed Sep. 28, 2001.

TECHNICAL FIELD OF THE INVENTION

This invention relates generally to the field of integrated circuits, and more particularly to transistors with bottomwall and sidewall junction capacitance reduction regions and a method for forming the same.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors, and other semiconductor devices. Typically, such devices are formed in and on a substrate and are interconnected to form an integrated circuit. One type of transistor is the metal oxide semiconductor field effect transistor (MOSFET) in which current flows through a narrow conductive channel between a source and drain and is modulated by an electric field applied at the gate electrode.

A problem with MOSFET transistors is bottomwall and sidewall capacitance which degrades device performance and can reduce the speed of a circuit. Efforts to bottomwall and sidewall junction capacitance have included tailoring of pocket implants, channel stop, and threshold adjust source/drain implants. All these implants serve other primary purposes. For example, pockets are used to minimize short channel effects. Threshold adjust is used for controlling device threshold. Channel stop is used for achieving isolation. Very deep source/drain implants result in increased short channel effects. For minimizing the bottomwall and sidewall junction capacitance, these implants require complex co-optimization and the reduction in bottomwall/sidewall capacitance may thus be limited.

SUMMARY OF THE INVENTION

The present invention provides a transistor with a bottomwall/sidewall junction capacitance reduction region that substantially eliminates or reduces the disadvantages and problems associated with prior systems and methods.

In accordance with one embodiment of the present invention, a method of fabricating a transistor comprises forming a gate structure outwardly of a semiconductor substrate, wherein the gate structure comprises a gate, a gate insulator and sidewalls and forming source region and a drain region in the substrate using the gate structure as a mask, wherein a channel is defined in the substrate between the source region and the drain region. A bottomwall/sidewall junction capacitance reduction region extending within and between the source region and the drain region is formed, wherein the bottomwall/sidewall junction capacitance reduction region extends at least partially through the bottomwall junction or the sidewall junction.

Technical advantages of the present invention include that the bottomwall/sidewall junction capacitance reduction can be adjusted relatively independently of, and reduce the dependence of the bottomwall and sidewall junction capacitance on, other implants and aspects of transistor fabrication (pocket implants, channel stop, threshold adjust, deep source/drains).

Another technical advantage of the present invention is the achievement of the ultra-low bottomwall and sidewall capacitance reduction (<0.7 fF/um2) needed for high-performance logic design.

Yet another technical advantage is that the same masking configuration may be used during the implantation of the source and drain regions and the bottomwall/sidewall junction capacitance reduction region, and no additional masking or etching step is required for formation of the bottomwall/sidewall junction capacitance reduction region.

Certain embodiments may possess none, one, some, or all of these technical features and advantages and/or additional technical features and advantages.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

FIGS. 1A–1F are a series of schematic cross-sectional diagrams illustrating fabrication of a transistor with a bottomwall/sidewall junction capacitance reduction region in accordance with one embodiment of the present invention. In this embodiment, the transistor may be one of a complementary set of metal oxide semiconductor field effect transistors (MOSFETs) of a sub-micron regime. It will be understood that the type and size of the transistor may be varied within the scope of the present invention.

Figure 1A:
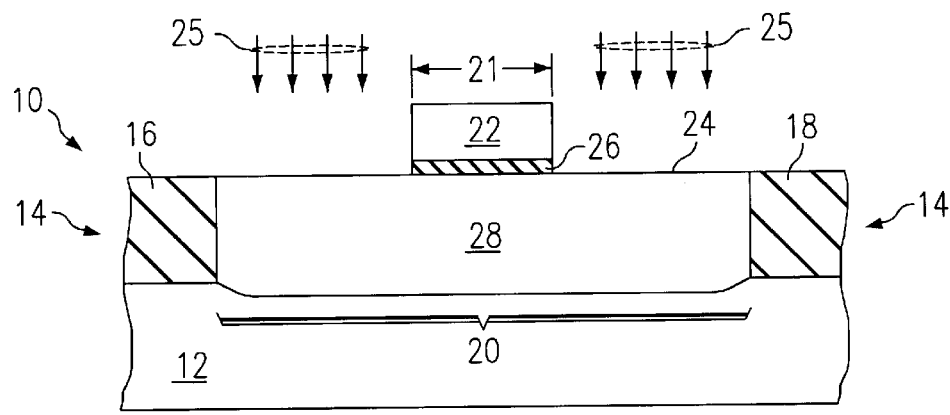
FIGS. 1A–F are a series of schematic cross-sectional diagrams illustrating fabrication of a transistor with a bottomwall/sidewall junction capacitance reduction region in accordance with one embodiment of the present invention.

Referring to FIG. 1A, an initial semiconductor structure 10 may comprise a semiconductor layer 12. The semiconductor layer 12 may be a substrate such as a wafer. In this embodiment, the semiconductor layer 12 may comprise a single-crystalline silicon material. It will be understood that the semiconductor layer 12 may also be a layer of semiconductor material formed on a substrate, a semiconductor on insulator (SOI) layer and the like. For example, the semiconductor layer 12 may be an epitaxial layer grown on a wafer.

A first isolation member 16 and a second isolation member 18 may be formed by Shallow Trench Isolation (STI) or Local oxidation (LOCOS) in the semiconductor layer 12.

The isolation members 16 and 18 may be independent structures or part of a unitary structure. For sub-micron applications, the isolation members 16 and 18 may comprise shallow isolation trenches. It will be understood that other types of isolation members and/or structures may be used within the scope of the present invention. For example, the isolation members 16 and 18 may comprise a field oxide.

The isolation members 16 and 18 may define an active area 20 in the semiconductor layer 12. As described in more detail below, source, drain and channel regions and/or structures, may be defined in the active area 20. A gate electrode may control the flow of current from the source region to the drain region through the channel region to operate the transistor. It will be understood that the active area 20 may comprise other suitable regions and structures.

A gate electrode 22 may be disposed over and insulated from the active area 20. The gate electrode may have a width 21 of about 0.05 to 10 microns, or may have a different width. In one embodiment, the gate electrode 22 may be separated from an outer surface 24 of the active area 20 by a gate insulator 26. In this embodiment, the gate electrode 22 may comprise polycrystalline silicon or other suitable semiconductor material. The gate insulator 26 may comprise silicon dioxide or other suitable insulating material. It will be understood that the gate electrode 22 may be otherwise suitably operationally associated with regions and structures in the active area 20. The width of the active area 20 may be from 0.05 microns to 10's of microns.

In this embodiment, the active area 20 may comprise a well 28 formed in the semiconductor layer 12. The well 28 may comprise the single-crystalline silicon material of the semiconductor layer 12 implanted with well dopants 25. In a particular embodiment, the transistor may comprise an n-MOS transistor and the well dopants 25 may comprise a p-type dopant such as boron. It will be understood that the semiconductor layer 12 may comprise other materials, may be suitably otherwise doped within the scope of the present invention, and that the well 28 may be omitted. For example, the semiconductor layer 12 may itself be slightly doped eliminating the need for the well 28. In another embodiment, the transistor may comprise a p-MOS transistor, in which case the semiconductor layer 12 may be doped with well dopants 25 of an n-type such as arsenic.

Figure 1B:
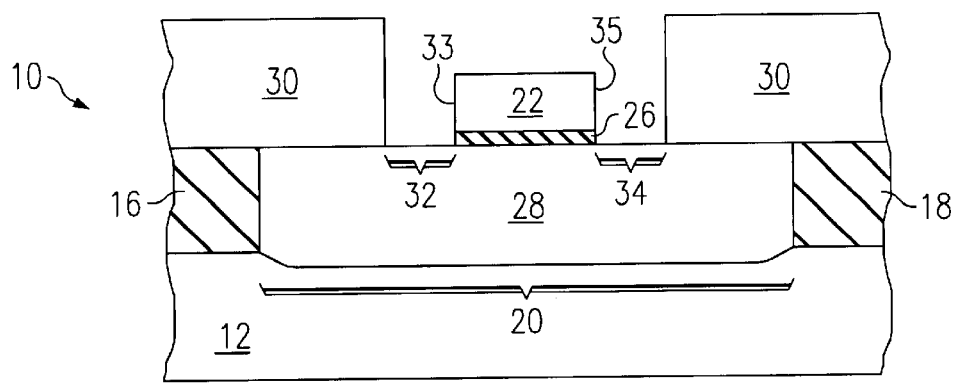

Referring to FIG. 1B, a masking layer 30 may be formed outwardly the semiconductor layer 12 and expose a first section 32 and a second section 34 of the active area 20. In one embodiment, the exposed first section 32 may be proximate to a first side 33 of the gate electrode 22 facing the first isolation member 16. The exposed second section 34 may be proximate to a second side 34 of the gate electrode 22 facing the second isolation member 18. It will be understood that the sections 32 and 34 exposed by the masking layer 30 may be suitably varied within the scope of the present invention.

The masking layer 30 may comprise photoresist material. In this embodiment, the masking layer 30 may be conventionally coated, patterned and etched to expose the first and second sections 32 and 34 of the active area 20. It will be understood that the masking layer 30 may comprise other suitable materials and/or be otherwise suitably formed within the scope of the present invention.

Figure 1C:
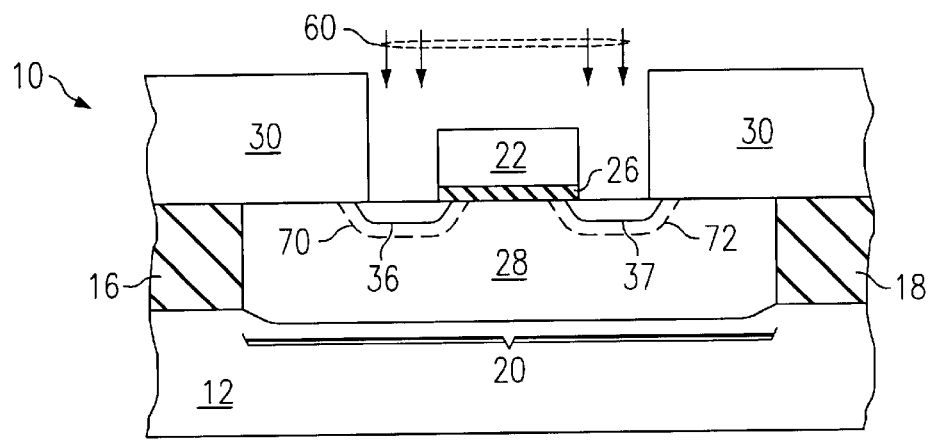

Referring to FIG. 1C, dopants 60 are implanted into the exposed first section 32 to form at least part of a source extension region and into the exposed second section 34 to form at least part of a drain extension region. The source/drain extension regions may be conventionally doped at an energy of <100 keV and a concentration of >1E14 $cm^{-2}$. In one embodiment, the doped exposed first section 32 may comprise a source extension 36. The doped exposed second section 34 may comprise a drain extension 37. It will be understood that the exposed first and second sections 32 and 34 of the active area 20 may comprise other suitable elements of the source and drain regions.

The source extension 36 is localized in that it is spaced apart from the first isolation member 16 and thus does not extend the distance between the gate electrode 22 and the first isolation member 16. Similarly, the drain extension 37 is localized in that it is spaced apart from the second isolation member 18 and thus does not extend the full distance between the gate electrode 22 and the second isolation member 18. Accordingly, the localized source and drain extensions 36 and 37 reduce implant damage to the source and drain regions. Accordingly, the main body and contacts of the source and drain regions may be formed with minimal interference from the extensions.

The localized source and drain extensions 36 and 37 may each vertically overlap the gate electrode 22 by <300 angstroms. This overlap may be induced by thermal treatment or other migration of the implanted dopants. It will be understood that the localized source and drain extensions 36 and 37 may be otherwise disposed with respect to the gate electrode 22. As used herein, the term each means every one of at least a subset of the identified items.

Pocket dopants may be implanted into the exposed sections 32 and 34 inwardly of the extensions 36 and 37 to form a source pocket 70 and a drain pocket 72. The pockets 70 and 72 may be used in connection with the extensions 36 and 37 to reduce gate length sensitivity of drive current. In one embodiment, the pocket dopants may be the dopants of the opposite type used to form the extensions 36 and 37, but be implanted in the semiconductor layer 12 at a higher energy. It will be understood that the pockets 70 and 72 may comprise dopants otherwise introduced within the scope of the present invention. For example, the pocket dopants may be implanted at the same or other energy.

For the embodiment where the transistor shown in FIGS. 1A–1F is an n-MOS transistor, the localized source and drain extensions 36 and 37 may each comprise n-type dopants such as arsenic implanted at an energy of <20 keV and a concentration of >1E14 $cm^{-2}$. In this embodiment, the localized source and drain pockets 70 and 72 may comprise p-type dopants such as boron or indium implanted at an energy of <50 keV (B) or <200 keV (In) and a concentration of >1E12 $cm^{-2}$. It will be understood that the localized source and drain extensions 36 and 37 and pockets 70 and 72 may be otherwise doped within the scope of the present invention. In another embodiment, the transistor may comprise a p-MOS transistor, in which case the localize source and drain extensions 36 and 37 may each comprise p-type dopants such as boron implanted at an energy of <10 keV (B) or <50 keV (BF2) and a concentration of >1E14 $cm^{-2}$ and the localized source and drain pockets 70 and 72 may comprise n-type dopants such as arsenic or phosphorous implanted at an energy of <200 keV (As) or <100 keV (Ph) and a concentration of >1E12 $cm^{-2}$.

After the localized source and drain extensions 36 and 37 and pockets 70 and 72 have been formed, the masking layer 30 may be conventionally removed.

Figure 1D:
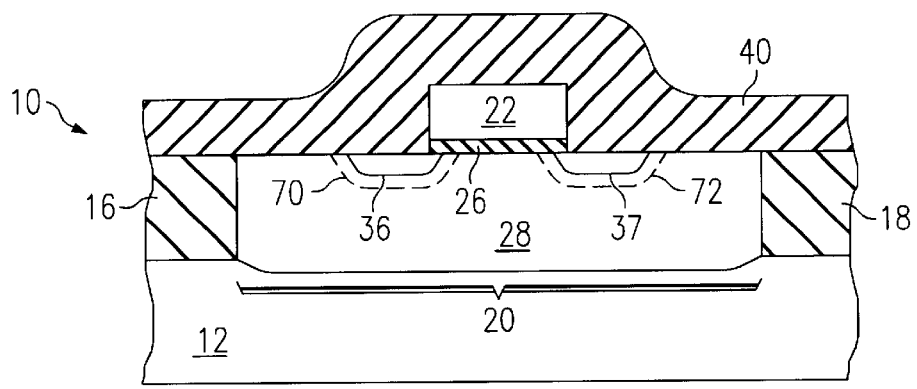

Referring to FIG. 1D, an insulating layer 40 is deposited outwardly of the semiconductor layer 12 and the gate electrode 22. In one embodiment, the insulating layer 40 may be deposited directly onto the semiconductor layer 12 and the gate electrode 22. In this embodiment, the insulating layer 40 may comprise an oxide and/or nitride layer. It will be understood that the insulating layer 40 may comprise other materials capable of insulating semiconductor elements.

Figure 1E:
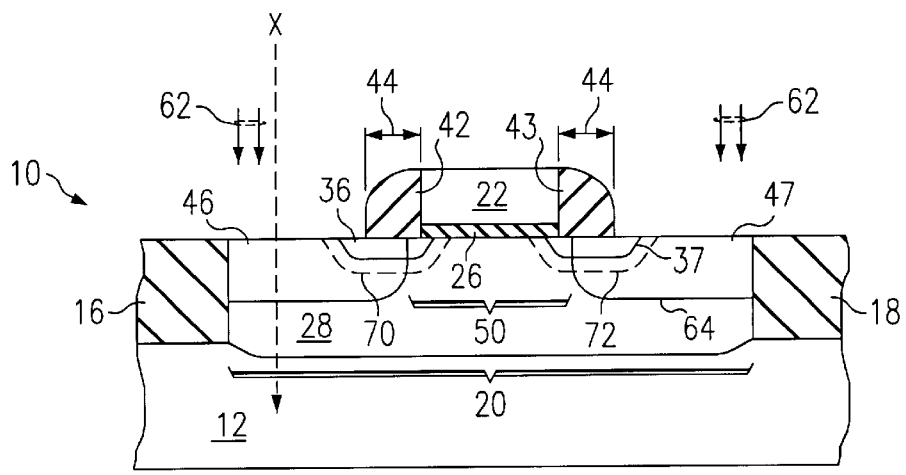

Referring to FIG. 1E, the insulating layer 40 is anisotropically etched to form a first sidewall 42 adjacent the first side 33 of the gate electrode 22 and a second sidewall 43 adjacent the second side 34 of the gate electrode 22. The anisotropic etch may be a conventional reactive ion etch (RIE) or other suitable etch. The sidewalls 42 and 43 may electrically isolate sides 33 and 34 of the gate electrode 22 from other elements of the transistor. The sidewalls 42 and 43 in this embodiment have a width 44 of approximately <2000 angstroms.

Dopants 62 are implanted into the exposed portions of the active area 20 between the first sidewall 42 and isolation member 16 to form a source region 46 and between the second sidewall 43 and isolation member 18 to form a drain region 47. A channel 50 is thus defined in the substrate between the source region and the drain region. For the embodiment where the transistor shown in FIGS. 1A–1F is an n-MOS transistor, the dopants 62 may comprise n-type dopants such as arsenic. For an n-MOS transistor, the dopants 62 may be implanted to a concentration of greater than about 1E14 $cm^{-2}$, at an energy of <200 keV. In another embodiment where the transistor shown in FIGS. 1A–1F is a p-MOS transistor, the dopants 62 may comprise p-type dopants such as boron. For a p-MOS transistor, the dopants 62 may be implanted to a concentration of greater than about 1E14 $cm^{-2}$, at an energy of <10 keV. A bottomwall junction 64 is defined at base of the source region 46 and the drain region 47, where the concentration of dopants 62 equals the concentration of well dopants 25 (n-dopant concentration= p-dopant concentration). Near the channel 50, where the bottomwall junction 64 curves upward towards the gate 22, the junction may be referred to as the sidewall junction.

In the illustrated embodiment wherein the transistor shown in FIGS. 1A–1F is an n-MOS transistor and if transistor elements of both n-MOS and p-MOS types are present in the same circuit, the pMOS type transistor element may be masked or otherwise covered during implantation of the dopants 62 in an n-MOS transistor element. Likewise, in another embodiment where the transistor shown in FIGS. 1A–1F is a p-MOS transistor and both types of elements are present in the same circuit, the n-MOS type transistor element may be masked or otherwise covered during implantation of the dopants 62 in a p-MOS transistor element.

Figure 1F:
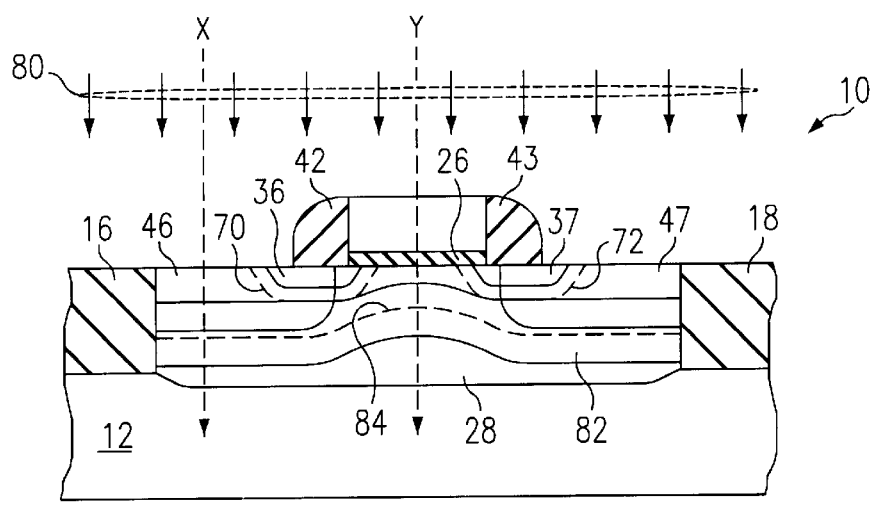

With reference to FIG. 1F, dopants 80 are implanted at a high energy into the active area 20 to form a bottomwall/ sidewall junction capacitance reduction region 82. If the transistor is an n-MOS type, the dopants 80 would be n-type. Likewise, if the transistor is an p-MOS type, the dopants 80 would be p-type. High-energy ion implantation of the dopants 80 (about 20–200 kV if the transistor is an n-MOS type transistor and about 30–100 kV if the transistor is a p-MOS type transistor) is sufficient to implant the dopants through the gate 22 and into the area of the channel 50.

Given dopant concentrations in the source region 46 and the drain region 47 as described in reference to FIG. 1E, concentrations of dopants comprising the bottomwall/ sidewall junction capacitance reduction region 82 may be about 1E12 $cm^{-2}$ to 1E14 $cm^{-2}$ for an n-MOS type transistor, and about 1E12 $cm^{-2}$ to 1E14 $cm^{-2}$ for a p-MOS type transistor. Such concentrations in the bottomwall/ sidewall junction capacitance reduction region 82 provide a smoothing and grading of the net dopant concentrations near the bottomwall and sidewall junctions, and reduce the net dopant concentration in the immediate area of the bottomwall and sidewall junctions. This effect is described further in reference to FIGS. 3A and 3B.

If p-MOS type transistors are present in the same circuit as the n-MOS transistor element and the p-MOS type transistors are masked or otherwise covered during implantation of the dopants 62 in the n-MOS transistor element, the mask may remain in the same configuration during the implantation of dopants 82 in the n-MOS transistor elements. Likewise, if n-MOS type transistors are present in the same circuit as the p-MOS transistor element and the n-MOS type transistors are masked or otherwise covered during implantation of the dopants 62 in the p-MOS transistor element, the mask may remain in the same configuration during the implantation of dopants 82 in the p-MOS transistor elements. Thus, the same masking configuration may be used during the implantation of the source and drain regions 46 and 47 and the bottomwall/sidewall junction capacitance reduction region 82, and no additional masking or etching step is required for formation of the bottomwall/ sidewall junction capacitance reduction region 82.

The range point 84 (shown as a dotted line) is the point of the highest concentration of the dopants 80 in the bottomwall/sidewall junction capacitance reduction region 82 at a given point along the active area 20. Further details concerning the concentration of the dopants 80 in the bottomwall/sidewall junction capacitance region 82 at points "X" and "Y" are described in reference to FIGS. 2A and 2B and FIGS. 3A and 3B, below.

Figure 2A:
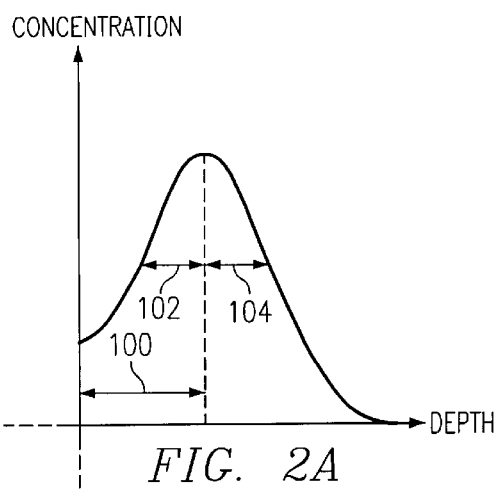
FIGS. 2A and 2B are exemplary, generalized (not to scale) plots of the concentration of bottomwall/sidewall junction capacitance reduction region dopants as a function of depth in accordance with one embodiment of the present invention.

FIG. 2A is an exemplary, generalized (not to scale) plot of the concentration of dopants 80 as a function of depth at point "X" on FIG. 1F in accordance with one embodiment of the present invention. The range 100 is the depth from the outer surface 20 to the range point 84 at X. Range 100 may measure about 2000 angstroms. An upper straggle 102 and a lower straggle 104 are defined by the distance from the range point 84 to the point where the concentration of dopants 80 in the bottomwall/sidewall junction capacitance reduction region is approximately equal to ((peak concentration)/($\sqrt{2}$)). The peak concentration of dopants 80 may be about 2E17 $cm^{-3}$ to 3E17 $cm^{-3}$. The straggles may measure approximately 300 angstroms for upper straggle 102 and approximately 300 angstroms for lower straggle 104.

Figure 2B:
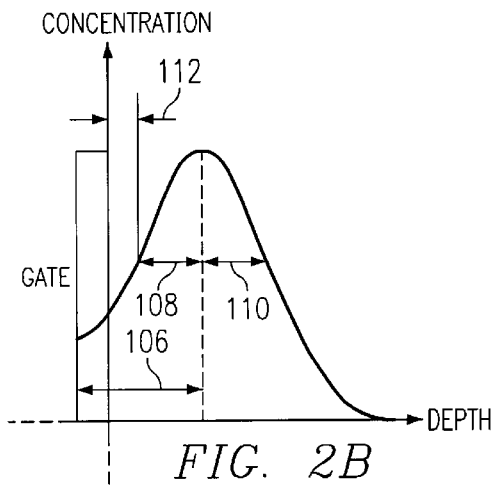

FIG. 2B is an exemplary, generalized plot of the concentration of dopants 80 as a function of depth at point "Y" on FIG. 1F in accordance with one embodiment of the present invention. The range 106 is the depth from the surface of the gate 20 to the range point 84 at Y. An upper straggle 108 and a lower straggle 110 are defined by the distance from the range point 84 to the point where the concentration of dopants 80 in the bottomwall/sidewall junction capacitance reduction region is approximately equal to ((peak concentration)/($\sqrt{2}$)). The peak concentration of dopants 80 may be about 2E17 $cm^{-3}$ to 3E17 $cm^{-3}$. The straggles may measure approximately 300 angstroms for upper straggle 108 and approximately 300 angstroms for lower straggle 110. A non-encroachment distance 112 is defined as the shortest distance between the base of the gate 20 (or of the gate insulator 26, if present) and the top of the upper straggle 108. In order to minimize encroachment by the bottomwall/ sidewall capacitance reduction region 82 into the inversion layer of the channel 50, the non-encroachment distance 112 should be at least about 150 angstroms.

Figure 3A:
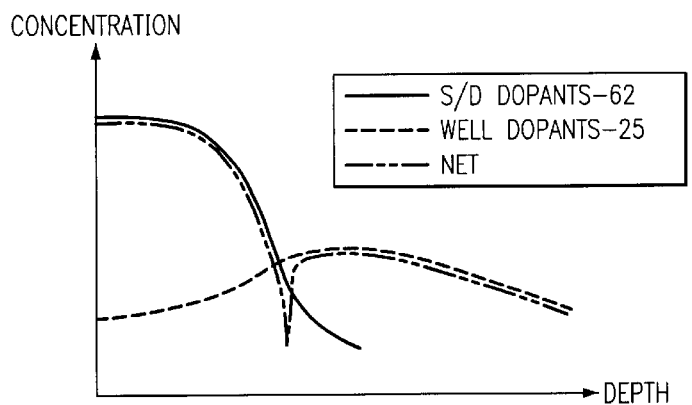
FIGS. 3A and 3B are exemplary, generalized (not to scale) plots of various dopant concentrations in accordance with one embodiment of the present invention.

FIG. 3A is an exemplary, generalized (not to scale) plot of the concentration at point "X" on FIG. 1E, as a function of depth, of source/drain dopants 62 and well dopants 25 in accordance with one embodiment of the present invention. As described above, well dopants 25 are of the opposite conductivity type as dopants 62. Also shown in FIG. 3A is the net concentration of dopants, which equals the difference in concentration of dopants 62 and well dopants 25.

Figure 3B:
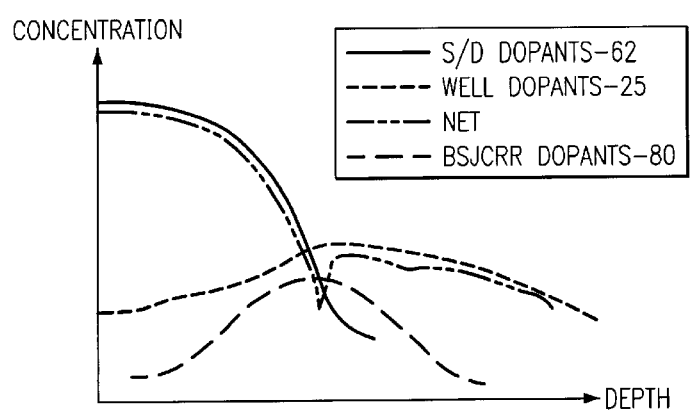

FIG. 3B is an exemplary, generalized (not to scale) plot of the concentration at point "X" on FIG. 1F, as a function of depth, of source/drain dopants 62, well dopants 25, and dopants 80 in accordance with one embodiment of the present invention. As above, dopants 80 form the bottomwall/sidewall junction capacitance reduction region in accordance with one embodiment of the present invention and are of the same conductivity type as dopants 62. The net concentration of dopants equals the sum of the concentrations of dopants 62 and dopants 80, minus the concentration of well dopants 25.

Capacitance varies in part as a function of the concentration of dopants at the junction, and also as a function of the shape or "grading" of the profile of the net concentration of dopants in the region of the bottomwall junction 64. It should be noted that the profile of the net concentration in FIG. 3B is somewhat smoother and more graded as opposed to the net concentration profile from FIG. 3A. Furthermore, the net concentration of dopants is lower in FIG. 3B than in FIG. 3A at the region just below the bottomwall junction 64. These features are an indication of the effect of the bottomwall/sidewall junction capacitance reduction region of reducing, relatively independently of other parameters, the bottomwall/sidewall junction capacitance. The use of the bottomwall/sidewall junction capacitance reduction region of the present method may allow for the achievement of ultra-low levels (<0.7 fF/um2) of bottomwall/sidewall junction capacitance, such low levels being favorable for high-performance logic design.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method of fabricating a transistor, comprising:

forming a gate structure outwardly of a semiconductor substrate, wherein the gate structure comprises a gate, a gate insulator and sidewalls;

forming source region and a drain region in the substrate using the gate structure as a mask, wherein a channel is defined in the substrate between the source region and the drain region; and forming a bottomwall/sidewall junction capacitance reduction region extending within and between the source region and the drain region, wherein the bottomwall/sidewall junction capacitance reduction region extends at least partially through the bottomwall junction or the sidewall junction.

2. The method of claim 1, wherein a concentration of dopants implanted to form the bottomwall/sidewall junction capacitance reduction region is about $1\times10^{12}$ cm$^{-2}$ to $1\times10^{14}$ cm$^{-2}$.

3. The method of claim 1, wherein the transistor is an n-MOS type transistor and the bottomwall/sidewall junction capacitance reduction region is implanted using energies of about 20–200 kV.

4. The method of claim 1, wherein the transistor is a p-MOS type transistor and the bottomwall/sidewall junction capacitance reduction region is implanted using energies of about 30–100 kV.

5. The method of claim 1, wherein a non-encroachment distance is at least about 150 angstroms.

6. The method of claim 5, wherein at least a portion of the bottomwall/sidewall junction capacitance reduction region is implanted through the gate structure.

7. The method of claim 1, wherein a dopant concentration of the bottomwall/sidewall junction capacitance reduction region peaks substantially at the bottomwall junction.

8. The method of claim 1, wherein the bottomwall/sidewall junction capacitance reduction region is formed with the same mask configuration for a complimentary transistor as is used during the formation of the source and drain regions.

* * * * *